United States Patent
Lin et al.

(10) Patent No.: US 12,363,981 B2
(45) Date of Patent: Jul. 15, 2025

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei (TW); Po-Cheng Tsai, Taichung (TW)

(73) Assignees: TAIWAN SEMICONDUCTOR MANUFACTURING COMPANY, LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 159 days.

(21) Appl. No.: 18/151,304

(22) Filed: Jan. 6, 2023

(65) Prior Publication Data
US 2024/0096976 A1    Mar. 21, 2024

Related U.S. Application Data

(60) Provisional application No. 63/408,680, filed on Sep. 21, 2022.

(51) Int. Cl.
*H10D 64/23* (2025.01)
*H01L 21/02* (2006.01)
(Continued)

(52) U.S. Cl.
CPC ..... *H10D 64/251* (2025.01); *H01L 21/02557* (2013.01); *H10D 62/40* (2025.01);
(Continued)

(58) Field of Classification Search
CPC .............. H10D 30/47; H10D 30/481–485
See application file for complete search history.

(56) References Cited

U.S. PATENT DOCUMENTS

| | | | |
|---|---|---|---|
| 2018/0013020 A1* | 1/2018 | Choi | H10F 77/244 |
| 2019/0378715 A1* | 12/2019 | Lin | H01L 21/02485 |
| 2020/0303417 A1* | 9/2020 | Teo | H10D 30/675 |

FOREIGN PATENT DOCUMENTS

KR         102299665 B1 *    2/2021    .............. C09K 3/18

OTHER PUBLICATIONS

Chong-Rong Wu et al., "The Growth Mechanism of Transition Metal Dichalcogenides by using Sulfurization of Pre- deposited Transition Metals and the 2D Crystal Hetero-structure Establishment", Sci. Rep., vol. 7, pp. 42146, Feb. 8, 2017.

(Continued)

*Primary Examiner* — Evren Seven
*Assistant Examiner* — Cole Leon Lindsey
(74) *Attorney, Agent, or Firm* — Maschoff Brennan

(57) ABSTRACT

A method includes forming a gate dielectric layer over a gate electrode layer; forming a 2-D material layer over the gate dielectric layer; forming source/drain contacts over source/drain regions of the 2-D material layer, in which each of the source/drain contacts includes an antimonene layer and a metal layer over the antimonene layer; and after forming the source/drain contacts, removing a first portion of the 2-D material layer exposed by the source/drain contacts, while leaving a second portion of the 2-D material layer remaining over the gate dielectric layer as a channel region.

20 Claims, 14 Drawing Sheets

(51) Int. Cl.
  *H10D 62/40*    (2025.01)
  *H10D 62/86*    (2025.01)
  *H10D 84/01*    (2025.01)
  *H10D 84/03*    (2025.01)

(52) U.S. Cl.
  CPC .......... *H10D 62/86* (2025.01); *H10D 84/013* (2025.01); *H10D 84/038* (2025.01)

(56) References Cited

OTHER PUBLICATIONS

Kuan-Chao Chen et al., "Van der Waals Epitaxy of Large-area and Single-crystalline Gold Films on MoS2 for Low-Contact-Resistance 2D-3D Interfaces", ACS Appl. Nano Mater., vol. 3, No. 3, pp. 2997-3003, Feb. 28, 2020.

Hsuan-An Chen et al., "Single-Crystal Antimonene Films Prepared by Molecular Beam Epitaxy: Selective Growth and Contact Resistance Reduction of the 2D Material Heterostructure", ACS Appl. Mater. Interfaces, vol. 10, No. 17, pp. 15058-15064, Apr. 13, 2018.

* cited by examiner

SEMICONDUCTOR DEVICE AND METHOD FOR FORMING THE SAME

PRIORITY CLAIM AND CROSS-REFERENCE

This application claims priority to U.S. Provisional Application Ser. No. 63/408,680, filed Sep. 21, 2022, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
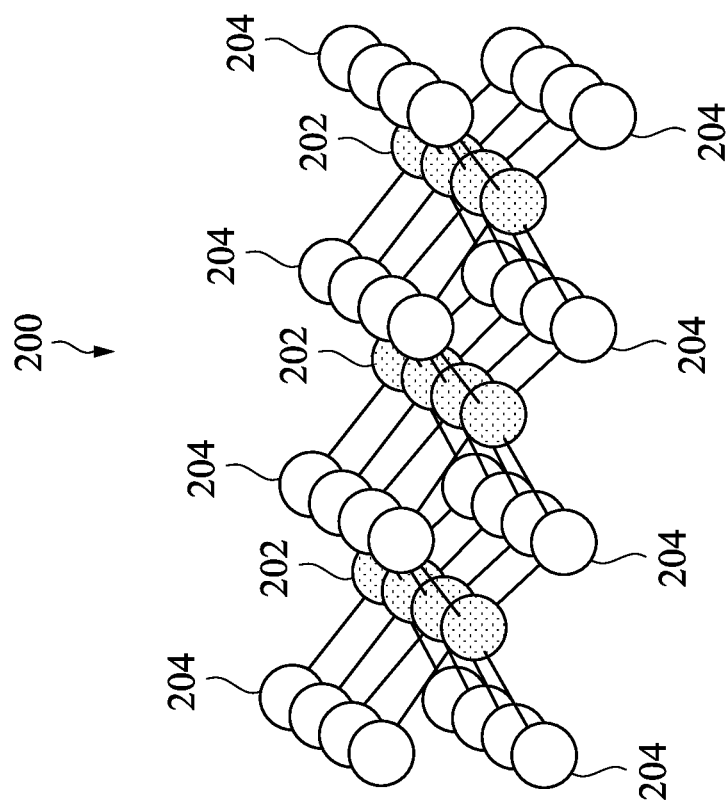
FIGS. 1A to 5 are schematic views of a semiconductor device in various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follow s may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 5 are schematic views of a semiconductor device in various stages of fabrication in accordance with some embodiments of the present disclosure. Although the views shown in FIGS. 1A to 5 are described with reference to a method, it will be appreciated that the structures shown in FIGS. 1A to 5 are not limited to the method but rather may stand alone separate of the method. Although FIGS. 1A to 5 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1A:
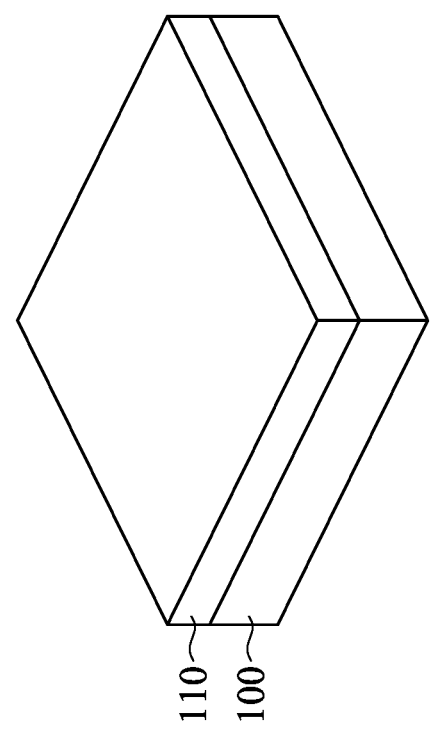

Reference is made to FIG. 1A. Shown there is a substrate 100. For example, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate including, as an example, $\alpha$-$Al_2O_3$. The substrate 100 may be a semiconductor substrate. Other elementary semiconductors like germanium may also be used for substrate 100. Alternatively or additionally, substrate 100 includes a compound semiconductor such as silicon carbide, gallium arsenide, indium arsenide, indium gallium arsenide (InGaAs) and/or indium phosphide.

A 2-D material layer 110 is deposited over the substrate 100. In some embodiments, the 2-D material layer 110 may be made of transition metal dichalcogenides (TMDs). That is, the 2-D material layer 110 is a metal-containing 2-D material layer. In some embodiment where the 2-D material layer 110 includes TMDs monolayers, the TMDs monolayers include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or the like.

As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise. The 2-D material layer 110A may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer. In some embodiments, the 2-D material layer 110 may be a single monolayer structure, or may also be a multi-layer structure.

FIG. 1B illustrates a schematic view of a mono-layer 200 of an example TMDs in accordance with some example embodiments. In FIG. 1B, the one-molecule thick TMDs material layer includes transition metal atoms 202 and chalcogen atoms 204. The transition metal atoms 202 may form a layer in a middle region of the one-molecule thick TMDs material layer, and the chalcogen atoms 204 may form a first layer over the layer of transition metal atoms 202, and a second layer underlying the layer of transition metal atoms 202. The transition metal atoms 202 may be W atoms or Mo atoms, while the chalcogen atoms 204 may be S atoms, Se atoms, or Te atoms. Throughout the description, the illustrated cross-bonded layers including one layer of transition metal atoms 202 and two layers of chalcogen atoms 204 in combination are referred to as a mono-layer 204 of TMDs.

In some embodiments where the 2-D material layer 110 is made of $MoS_2$, the 2-D material layer 110 can be formed either by a first deposition process or by a second deposition process, which will be discussed below. The first deposition process may include using RF sputtering. For example, a Mo film is deposited over the substrate 100 using a RF sputtering. In some embodiments, the RF sputtering includes using a constant sputtering power in a range from about 25 W to about 35 W (e.g., 30 W), under a pressure in a range from about $4 \times 10^{-3}$ Torr to about $6 \times 10^{-3}$ Torr (e.g. $5 \times 10^{-3}$ Torr), with a gas flow of argon (Ar) in a range from about 25 sccm to about 35 sccom (e.g., 30 sccm). In some embodiments, the duration of depositing the Mo film is in a range from about 35 sec. to about 40 sec. (e.g., 37 sec.). After the metal (e.g., Mo film) is deposited over the substrate 100. The substrate 100 is taken out of the chamber to form a MoOX in ambient condition. That is, a nature oxide of the Mo film may be formed over the substrate 100 when the sample is exposed to the air. Afterwards, the substrate 100, with the MoOX film disposed thereon, is transferred in to a hot furnace for sulfurization. During the sulfurization process, about 180 sccm to about 220 sccm (e.g., 200 sccm) Ar gas is used as carrier gas, and the pressure is kept at about 40 torr to about 60 torr (e.g., 50 torr). The sulfurization temperature is kept at about 800° C. to about 900° C. (e.g., 850° C.) with about 0.2 g to 0.3 g (e.g., 0.25 g) of sulfur (S) powder, and the sulfurization process is performed for about 15 minutes to about 25 minutes (e.g., 20 minutes). In some embodiments, the 2-D material layer 110 may be deposited over the substrate 100 using suitable deposition process, such as e-bean deposition, molecular beam epitaxy (MBE), thermal evaporation, or the like.

The second deposition process may include using atomic layer deposition (ALD) process. For example, a $MoO_3$ film may be deposited over the substrate 100 using an ALD process. In a deposition cycle of the ALD process, a first precursor of molybdenum hexacarbonyl ($Mo(Co)_6$) and a second precursor of ozone ($O_3$) are sequentially supplied into a deposition chamber to deposit a $MoO_3$ film over the substrate 100. In some embodiments, the ALD process is performed under a temperature in a range from about 170° C. to about 190° C. (e.g., 180° C.). In some embodiments, the thickness of a $MoO_3$ film grown from a ALD cycle is about 0.5 Å. In some embodiments, about 20-25 deposition cycles of ALD process may be performed, such that the thickness of the $MoO_3$ film is about 1 nm. Afterwards, the substrate 100, with the $MoO_3$ film disposed thereon, is transferred in to a hot furnace for sulfurization. During the sulfurization process, about 180 sccm to about 220 sccm (e.g., 200 sccm) Ar gas is used as carrier gas, and the pressure is kept at about 40 torr to about 60 torr (e.g., 50 torr). The sulfurization temperature is kept at about 800° C. to about 900° C. (e.g., 850° C.) with about 0.2 g to 0.3 g (e.g., 0.25 g) of sulfur (S) powder, and the sulfurization process is performed for about 15 minutes to about 25 minutes (e.g., 20 minutes).

Figure 6:
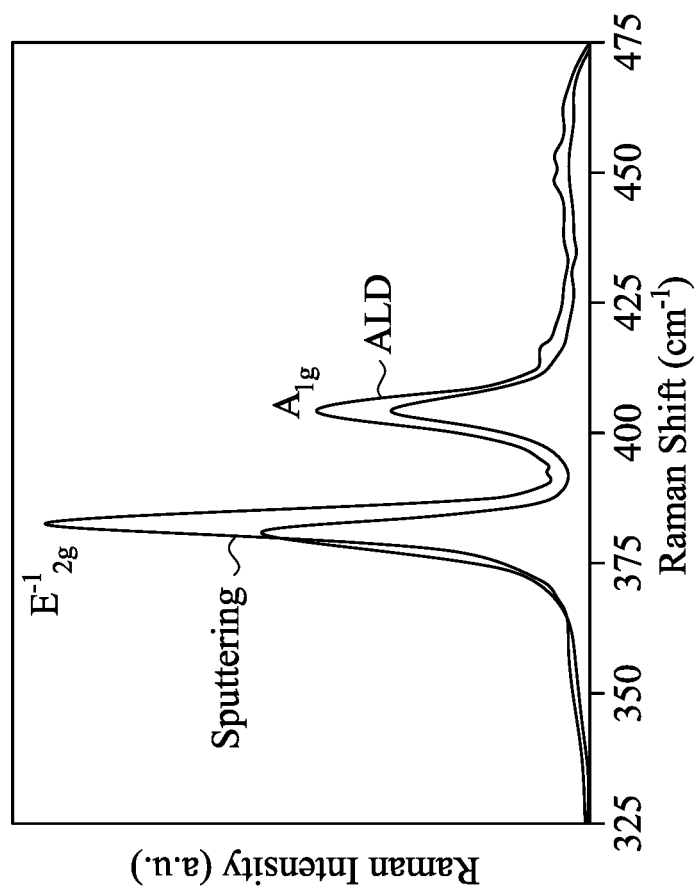
FIG. 6 is an experiment result in accordance with some embodiments of the present disclosure.

FIG. 6 is an experiment result in accordance with some embodiments of the present disclosure. In FIG. 6, the Raman spectrum of the two samples prepared by using RF sputtering and ALD process are shown. As shown in FIG. 6, the same Raman peak differences (Δk) 23.4 cm$^{-1}$ are observed for the two samples, which indicate that the same tri-layer $MoS_2$ films are obtained by using these two approaches. However, compared with the FWHM value 6.2 cm$^{-1}$ of the $E^1_{2g}$ Raman peak for the sample prepared by sputtering, a lower value 5.3 cm$^{-1}$ is observed for the sample prepared by using the ALD process. The results suggest that a better crystallinity may be obtained for the sample formed by the ALD process.

Figure 2:
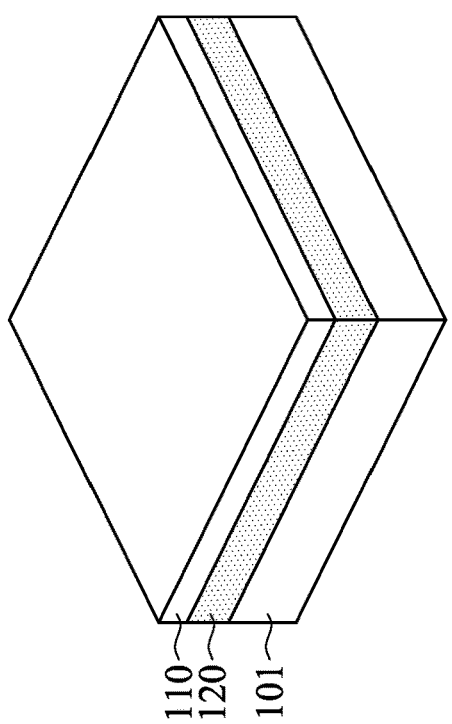

Reference is made to FIG. 2. The 2-D material layer 110 is transferred from the substrate 100 to a substrate 101. In greater details, the 2-D material layer 110 is transferred to a dielectric layer 120 formed on a top surface of the substrate 101. In various embodiments, the transfer process may be performed using polydimethylsiloxane (PDMS), poly(methyl methacrylate) (PMMA)-assisted method, thermal release tape, a roll-to-roll transfer process, an electrochemical process, a direct transfer process (e.g., using applied pressure and/or heat), or other wet and/or dry transfer processes. In some embodiments, the 2-D material layer 110 is transferred to the substrate 101 using PDMS stamping.

As an example of PMMA-assisted method, a polymer film, such as poly(methyl methacrylate) (PMMA), is formed on the 2-D material layer 110 disposed on the substrate 100. After forming the polymer film, the sample is heated, such as by placing the sample on a hot plate. Subsequent to heating, a corner of the 2-D material layer 110 is peeled off the substrate 100, such as by using a tweezers, and the sample is submerged in a solution to facilitate the separation of the 2-D material layer 110 from the substrate 100. The 2-D material film and polymer film are transferred to the dielectric layer 120 on the substrate 101. The polymer film is then removed from the 2-D material layer 110 using a suitable solvent, while leaving the 2-D material layer 110 over the dielectric layer 120.

In some embodiments, the substrate 101 may be a conductive substrate, which may include p-doped polysilicon. In some embodiments, the conductive substrate 101 may act as a gate electrode and the dielectric layer 120 may act a gate dielectric layer. In some embodiments, the dielectric layer 120 is silicon dioxide, in other embodiments the dielectric layer 120 is a high-k dielectric. The 2-D material layer 110 may act as a channel region of a transistor. Accordingly, the conductive substrate 101 can also be referred to as a gate electrode, the dielectric layer 120 can also be referred to as a gate dielectric layer, and the 2-D material layer 110 can also be referred to as a 2-D material channel layer. In some embodiments, the dielectric layer 120 and the conductive substrate 101 can be collectively referred to as a gate structure 135.

In some embodiments, after the 2-D material layer 110 is transferred to the substrate 101, a treating process may be performed to the 2-D material layer 110 to obtain expected electronic properties of the 2-D material layer 110. The treating processes include thinning (namely, reducing the thickness of the 2-D material layer 110), doping, or straining, to make the 2-D material layer 110 exhibit certain semiconductor properties, e.g., including direct bandgap. The thinning of the 2-D material layer 110 may be achieved through various suitable processes, and all are included in the present disclosure. For example, plasma based dry etching, e.g., reaction-ion etching (RIE), may be used to reduce the number of monolayers of the 2-D material layer 110. In some embodiments, the 2-D material layer 110 may be doped with n-type dopants to form an n-type channel. The 2-D material layer 110 may be doped with p-type dopants to form a p-type channel.

Figure 3:
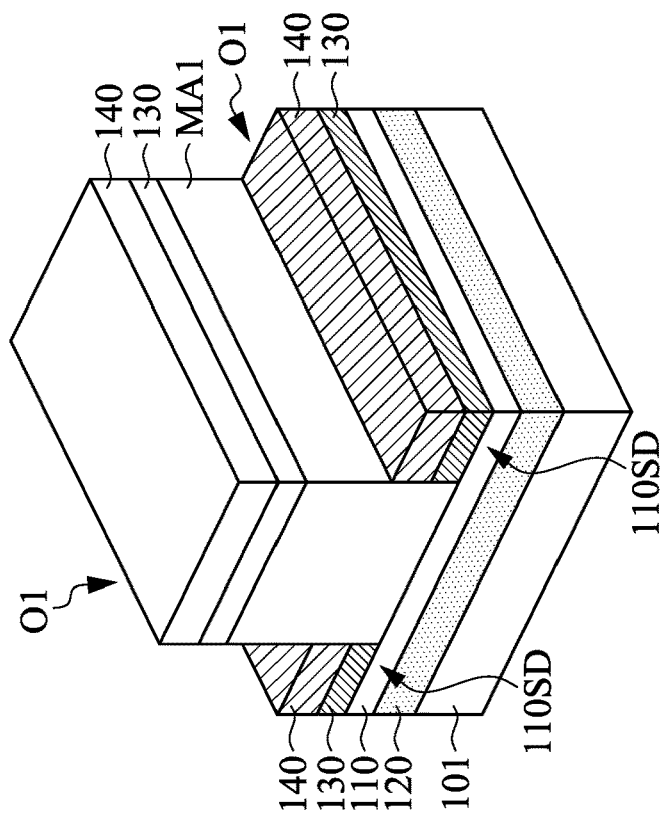

Reference is made to FIG. 3. A patterned mask MA1 is formed over the 2-D material layer 110. In some embodiments, the patterned mask MA1 may include openings O1 that expose regions 110SD of the 2-D material layer 110. In some embodiments, the regions 110SD of the 2-D material layer 110 can also be referred to as source/drain regions. In some embodiments, the patterned mask MA1 may be made of a photoresist, and may be patterned using suitable photolithography process.

After the patterned mask MA1 is formed, a first metal layer 130 is deposited over the substrate 101. In some embodiments, the first metal layer 130 may fill the openings O1 of the patterned mask MA1 and in contact with the regions 110SD of the 2-D material layer 110. In some embodiments, the first metal layer 130 may also be deposited over the top surface of the patterned mask MA1. In some embodiments, the first metal layer 130 may be deposited using a suitable deposition process, such as an e-beam evaporation process, or the like. In some embodiments, the deposition temperature of the first metal layer 130 can be ranged from room temperature (e.g., 25° C.) to about 300° C. In other embodiments, the deposition temperature of the first metal layer 130 can be ranged from 70° C. to about 80° C., such as 75° C. If the temperature is too low (e.g., much lower than 25° C. or 70° C.), the device performance may be unsatisfied. If the temperature is too high (e.g., much higher than 80° C. or 300° C.), the high temperature would deteriorate the quality of patterned mask MA1, and may adversely affect the formation of source/drain contact.

Then, a second metal layer 140 is deposited over the substrate 101. In some embodiments, the second metal layer 140 may fill the openings O1 of the patterned mask MA1 and in contact with top surfaces of the portions of the first metal layer 130 in the openings O1 of the patterned mask MA1. In some embodiments, the second metal layer 140 may also be deposited over the portion of the first metal layer 130 that is over the top surface of the patterned mask MA1. In some embodiments, the second metal layer 140 may be deposited using a suitable deposition process, such as an e-beam evaporation process, or the like. In some embodiments, the first metal layer 130 and the second metal layer 140 may be in contact with sidewalls of the patterned mask MA1.

In some embodiments, the 2-D material layer 110 may function as n-type channel layer. In such condition, metals with work function value that is smaller than the work function value of the 2-D material layer 110 may be suitable candidates as the Ohmic contact metals for n-channel transistors. Accordingly, if the 2-D material layer 110 is made of $MoS_2$, the work function value of the first metal layer 130 may be smaller than the work function value of the $MoS_2$ 2-D material layer 110 (e.g., 5.0 4 eV). In some embodiments, the first metal layer 130 may be titanium (Ti), and the work function value of Ti is about 4.33 eV. In other embodiments, the first metal layer 130 may be germanium (Ge), and the work function value of Ge is about 4.20 eV. In other embodiments, the first metal layer 130 may be tin (Sn), and the work function value of Sn is about 3.81 eV. In other embodiments, the first metal layer 130 may be bismuth (Bi), and the work function value of Bi is about 4.1 eV. In some embodiments, the difference between the work function value of the first metal layer 130 and the work function value of the 2-D material layer 110 may be less than about 1.5 eV.

In some embodiments, the 2-D material layer 110 may function as p-type channel layer. In such condition, metals with work function value that is larger than the work function value of the 2-D material layer 110 may be suitable candidates as the Ohmic contact metals for n-channel transistors. Accordingly, if the 2-D material layer 110 is made of $MoS_2$, the work function value of the first metal layer 130 may be larger than the work function value of the $MoS_2$ 2-D material layer 110 (e.g., 5.0 4 eV). In some embodiments, the first metal layer 130 may be gold (Au), and the work function value of Au is about 5.12 eV. In other embodiments, the first metal layer 130 may be platinum (Pt), and the work function value of Pt is about 5.12 eV to about 5.93 eV. In other embodiments, the first metal layer 130 may be nickel (Ni), and the work function value of Ni is about 5.04 eV to about 5.35 eV. In other embodiments, the first metal layer 130 may be tungsten (W), and the work function value of W is about 4.32 eV to about 5.22 eV. In some embodiments, the difference between the work function value of the first metal layer 130 and the work function value of the 2-D material layer 110 may be less than about 1.5 eV.

In some embodiments, the first metal layer 130 and the second metal layer 140 are made of different materials. For example, the first metal layer 130 may be made of titanium (Ti), and the second metal layer 140 is made of gold (Au). In some embodiments, the work function value of the first metal layer 130 may be smaller than the work function value of the second metal layer 140. In some embodiments, the second metal layer 140 may thicker than the first metal layer 130. For example, in some embodiments, the first metal layer 130 has a thickness in a range from about 15 nm to 25 nm (e.g., 20 nm), and the second metal layer 140 has a thickness in a range from about 90 nm to 110 nm (e.g., 100 nm).

Figure 4:
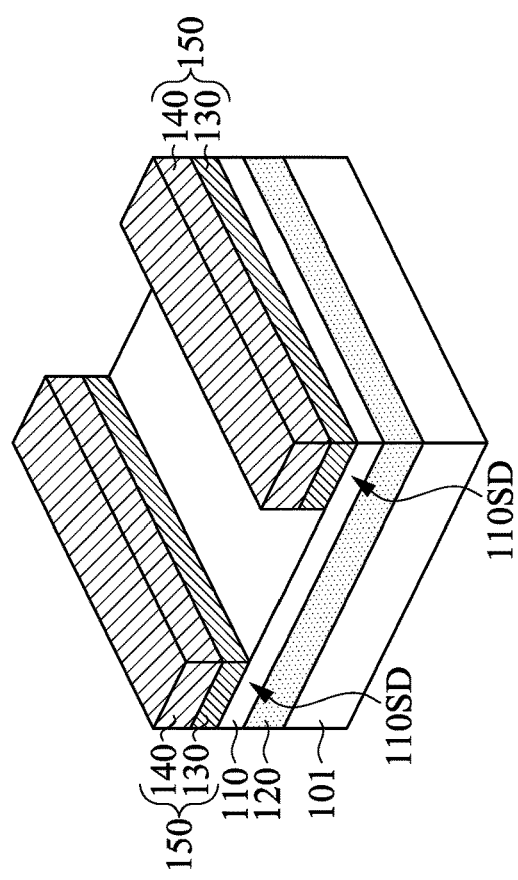

Reference is made to FIG. 4. The patterned mask MA1 is removed, leaving portions of the first and second metal layers 130 and 140 in the openings O1 of the patterned mask MA1 over the regions 110SD of the 2-D material layer 110. On the other hand, portions of the first and second metal layers 130 and 140 over the top surface of the patterned mask MA1 are removed together with the patterned mask MA1.

In some embodiments, the patterned mask MA1 may be removed using a lift-off process. For example, the substrate 101 is immersed into a tank of appropriate solvent that will react with the patterned mask MA1. The patterned mask MA1 swells, dissolves, and lifts off the portions of the first and second metal layers 130 and 140 over the top surface of the patterned mask MA1, leaving the portions of the first and second metal layers 130 and 140 in the openings O1 of the patterned mask MA1 remaining over the 2-D material layer 110.

After the patterned mask MA1 is removed, source/drain contacts 150 are formed. In some embodiments, each of the source/drain contacts 150 includes a first metal layer 130 and a second metal layer 140 over the first metal layer 130. In some embodiments, because the patterns of the first metal layer 130 and the second metal layer 140 are defined by the patterned mask MA1, the respective edges (or sidewalls) of the first metal layer 130 and the second metal layer 140 of each source/drain contact 150 are substantially vertically aligned and are substantially co-terminus.

In some other embodiments, aside from the lift-off procedure as described in FIGS. 3 and 4, the source/drain contacts 150 may also be formed by, for example, depositing a first metal layer 130 and a second metal layer 140 over the substrate 101, and then performing a patterning process to selectively etch (or remove) unwanted portions of the first metal layer 130 and the second metal layer 140.

Figure 5:
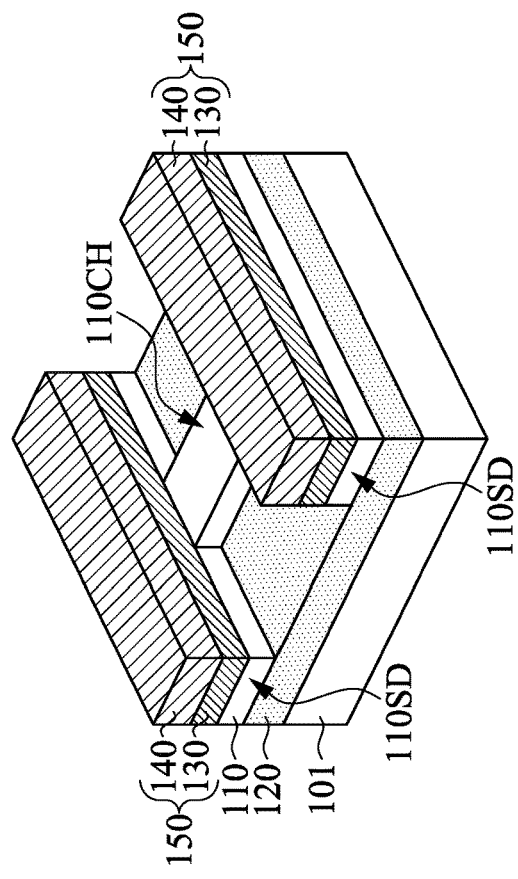

Reference is made to FIG. 5. The 2-D material layer 110 is patterned, so as to form a channel region 110CH in the 2-D material layer 110 this is between the source/drain regions 110SD of the 2-D material layer 110. In some embodiments, the 2-D material layer 110 can be patterned by, for example, forming a patterned mask over the substrate 101, the patterned mask includes openings that expose unwanted portions of the 2-D material layer 110. An etching process is performed to remove the unwanted portions of the 2-D material layer 110, while other portions of the 2-D material layer 110 under the patterned mask are protected by the patterned mask during the etching process. After the etching process is completed, the patterned mask is removed. In some embodiments, the etching process may include suitable etching process, such as reactive-ion etching (RIE), or the like.

After the channel region 110CH is formed in the 2-D material layer 110, a transistor may be formed. In some embodiments, the transistor may include a 2-D material channel layer 110, a gate structure 135 disposed on a bottom surface of the 2-D material channel layer 110, and source/drain contacts 150 disposed on a top surface of the 2-D material channel layer 110. That is, the gate structure 135 and the source/drain contacts 150 are disposed on opposite sides of the 2-D material layer 110, respectively. In some embodiments, the gate structure 135 may cover the source/drain regions 110SD and the channel region 110CH of the 2-D material layer 110, while the source/drain contacts 150 may cover the source/drain regions 110SD of the 2-D material layer 110 but does not cover the channel region 110CH of the 2-D material layer 110. That is, top surface of the channel region 110CH of the 2-D material layer 110 may be exposed by the source/drain contacts 150.

In some embodiments, the channel region 110CH of the 2-D material layer 110 may include a channel length and a channel width. Here, the term "channel length" may be the dimension of the channel region 110CH along the current flow direction (e.g, direction from one source/drain region 110SD toward another source/drain region 110SD), and the term "channel width" may be the dimension of the channel region 110C that is perpendicular to the current flow direction. In some embodiments, the channel width is in a range from about 140 μm to about 160 μm (e.g., 150 μm), the channel length is in a range from about 4 μm to about 6 μm (e.g., 5 μm). In some embodiments, the source/drain region 110SD is wider than the channel region 110CH along a direction that is parallel to the channel width direction.

Figure 7:
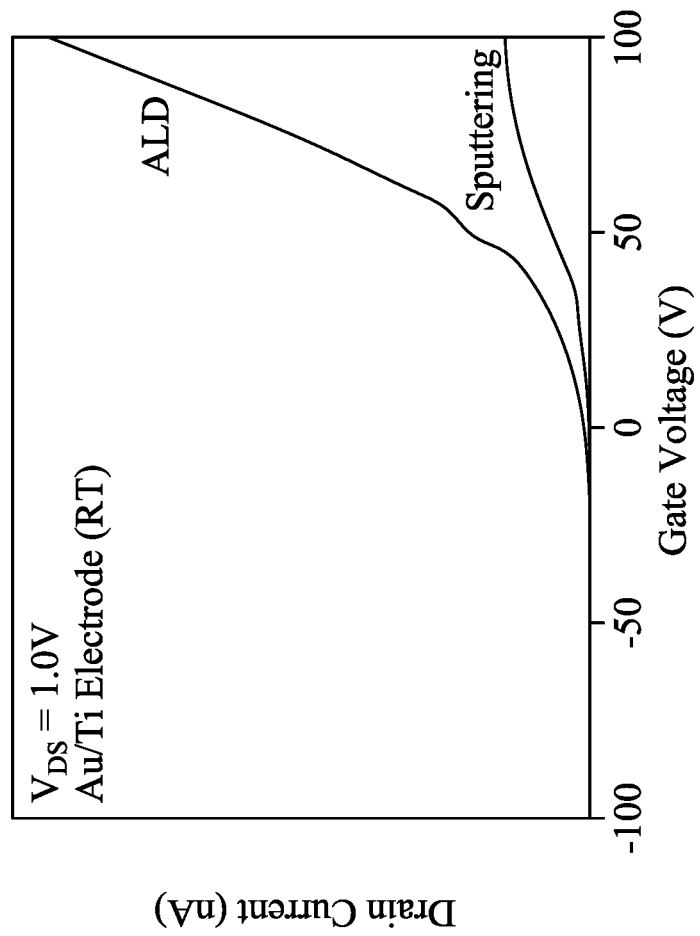
FIG. 7 is an experiment result in accordance with some embodiments of the present disclosure.

FIG. 7 is an experiment result in accordance with some embodiments of the present disclosure. In FIG. 7, the transfer curves of the two devices are shown, in which the 2-D material layer 110 of two samples are prepared by RF sputtering and ALD process as described in FIG. 1A. By using the equation $\mu=(dI_{DS}/dV_{GS})\times(L/W)\times(t/\varepsilon)\times V_{DS}^{-1}$, the electron mobility values of the two devices derived through the transfer curves are $3.16\times10^{-3}$ (using RF sputtering) and $2.29\times10^{-2}$ (using ALD process) $cm^2V^{-1} s^{-1}$, respectively. The results shown that higher drain currents are also observed for the ALD sample. The results demonstrate that compared with the RF sputtering, ALD may provide a better $MoO_3$ distribution in nanometer-thin thicknesses. A more continuous film with less defects may be obtained in the 2-D material layer 110 formed by ALD process, which in turn will results in higher drain currents.

Figure 8B:
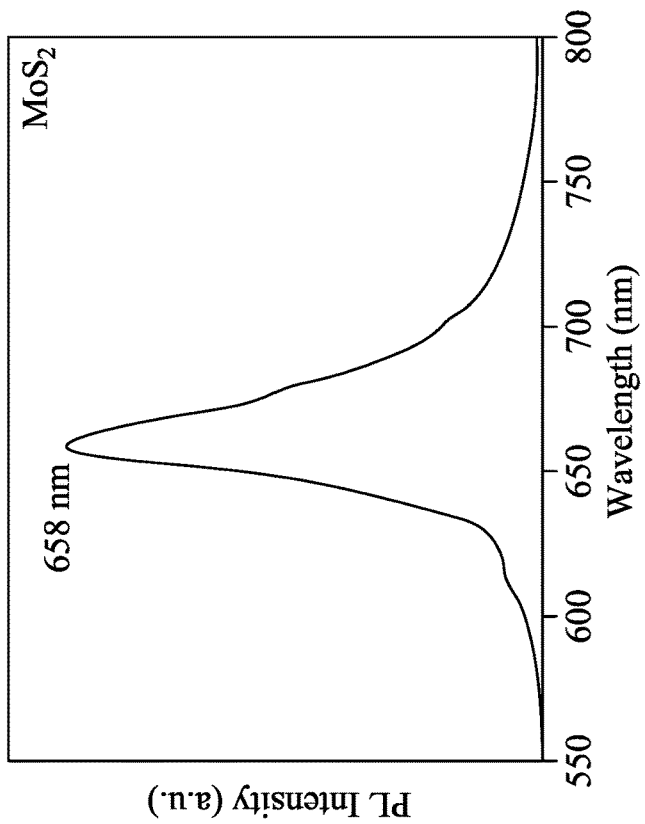
FIGS. 8A and 8B are experiment results in accordance with some embodiments of the present disclosure.
Figure 8A:
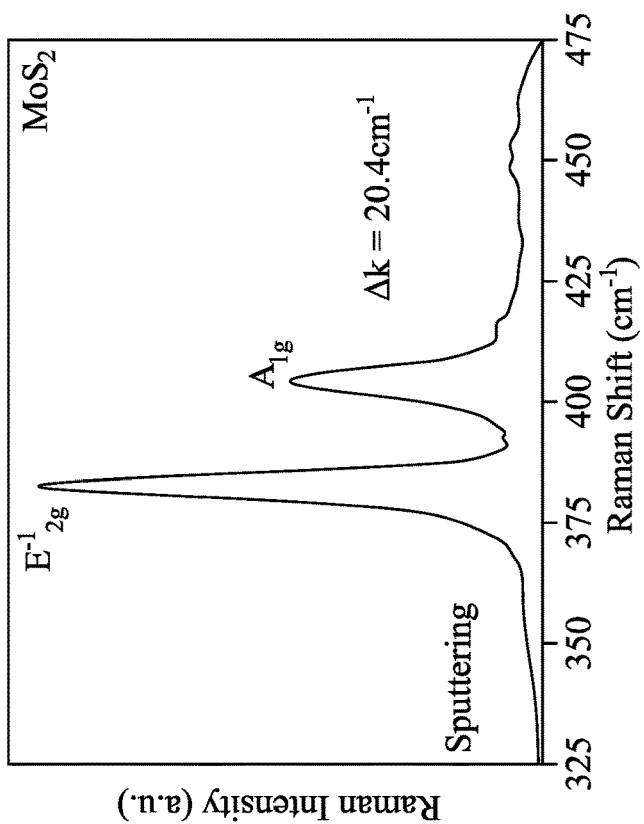

FIGS. 8A and 8B are experiment results in accordance with some embodiments of the present disclosure. To demonstrate the influence of different contact metals to the device performances, a mono-layer $MoS_2$ sample is fabricated over a substrate by using an atomic layer deposition system. The Raman and PL spectrum of the mono-layer $MoS_2$ sample grown on sapphire substrate are shown in FIGS. 8A and 8B, respectively. As shown in FIG. 8A, the Raman peak differences ($\Delta k$) 20.4 $cm^{-1}$ is observed for the sample, which indicates that mono-layer $MoS_2$ film is obtained after the growth procedure. The PL spectrum of the sample is shown in FIG. 8B. As shown in the figure, intense PL intensity at peak wavelength 658 nm is observed, which is consistent with the observation from the Raman spectrum that mono-layer $MoS_2$ is obtained after the growth procedure.

FIGS. 9 to 13 are schematic views of a semiconductor device in various stages of fabrication in accordance with some embodiments of the present disclosure. It is noted that some elements of FIGS. 9 to 13 are similar to or the same as those described in FIGS. 1A to 5, such elements are labeled the same, and relevant details will not be repeated for brevity.

Figure 9:
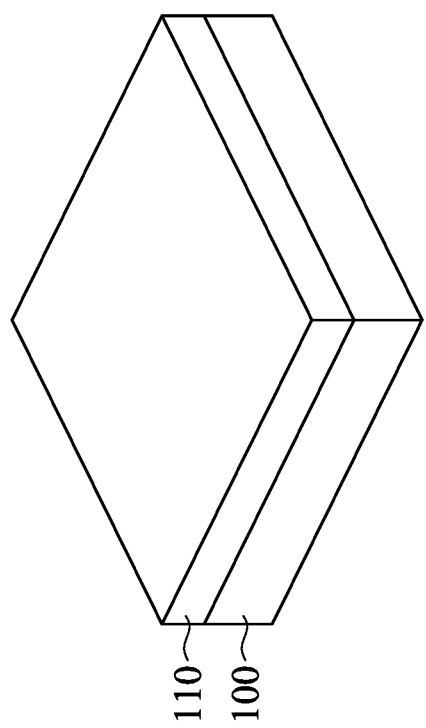
FIGS. 9 to 13 are schematic views of a semiconductor device in various stages of fabrication in accordance with some embodiments of the present disclosure.

Reference is made to FIG. 9. Shown there is a substrate 100. Then, a 2-D material layer 110 is deposited over the substrate 100. In some embodiments, the 2-D material layer 110 may be made of transition metal dichalcogenides (TMDs).

Figure 10:
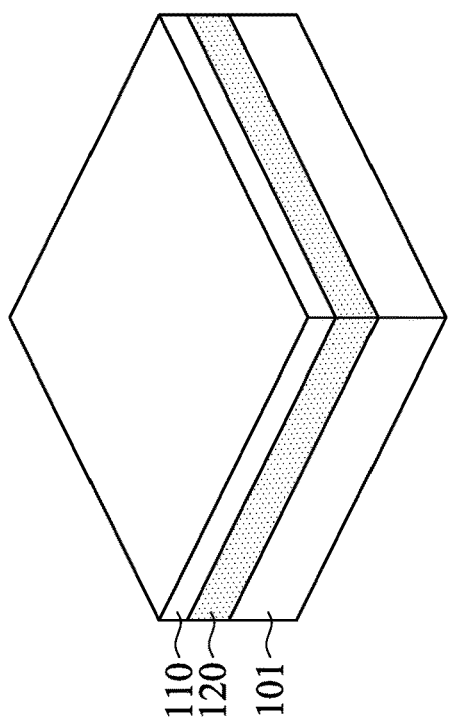

Reference is made to FIG. 10. The 2-D material layer 110 is transferred from the substrate 100 to a substrate 101. In greater details, the 2-D material layer 110 is transferred to a dielectric layer 120 formed on a top surface of the substrate 101.

Figure 11:
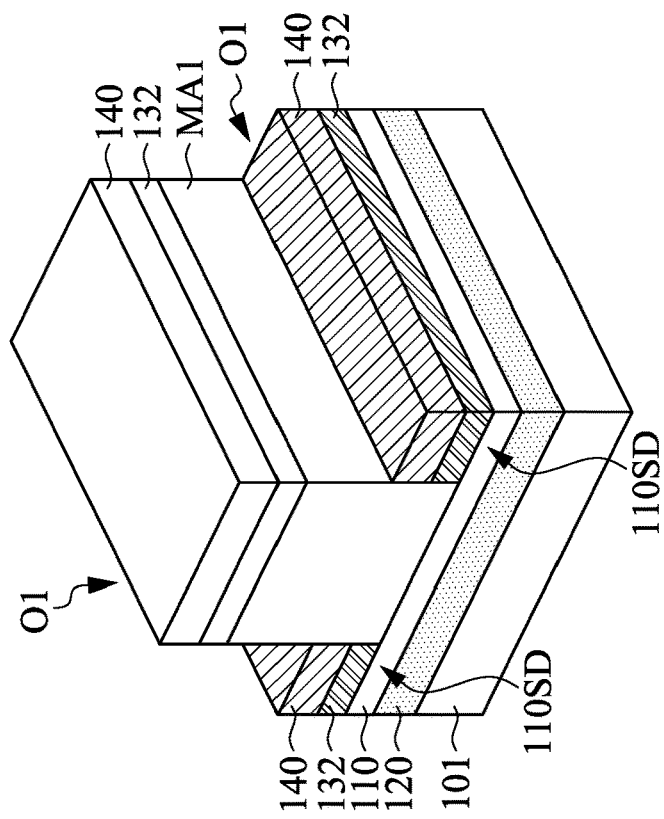

Reference is made to FIG. 11. A patterned mask MA1 is formed over the 2-D material layer 110. In some embodiments, the patterned mask MA1 may include openings O1 that expose regions 110SD of the 2-D material layer 110.

After the patterned mask MA1 is formed, a first metal layer 132 is deposited over the substrate 101. In some embodiments, the first metal layer 132 may fill the openings O1 of the patterned mask MA1 and in contact with the regions 110SD of the 2-D material layer 110. In some embodiments, the first metal layer 132 may also be deposited over the top surface of the patterned mask MA1. In some embodiments, the first metal layer 132 may be deposited using a suitable deposition process, such as an e-beam evaporation process, or the like.

In some embodiments, the first metal layer 132 is made of a single element 2-D material. For example, the first metal layer 132 is made of antimonene. Specifically, antimonene is 2-D allotrope of antimony (Sb). In some embodiments, the deposition temperature of the first metal layer 132 can be ranged from room temperature (e.g., 25° C.) to about 300° C. In other embodiments, the deposition temperature of the first metal layer 130 can be ranged from 70° C. to about 80° C., such as 75° C. If the temperature is too low (e.g., much lower than 25° C. or 70° C.), the device performance may be unsatisfied. If the temperature is too high (e.g., much higher than 80° C. or 300° C.), the high temperature would deteriorate the quality of patterned mask MA1, and may adversely affect the formation of source/drain contact. In some embodiments where the first metal layer 132 is made of antimonene under a deposition temperature ranged from 70° C. to about 80° C., the first metal layer 132 includes a polycrystalline structure rather than a single crystalline structure.

Then, a second metal layer 140 is deposited over the substrate 101. In some embodiments, the second metal layer 140 may fill the openings O1 of the patterned mask MA1 and in contact with top surfaces of the portions of the first metal layer 132 in the openings O1 of the patterned mask MA1. In some embodiments, the second metal layer 140 may also be deposited over the portion of the first metal layer 132 that is over the top surface of the patterned mask MA1. In some embodiments, the second metal layer 140 may be deposited using a suitable deposition process, such as an e-beam evaporation process, or the like. In some embodiments, the first metal layer 132 and the second metal layer 140 may be in contact with sidewalls of the patterned mask MA1.

Figure 12:
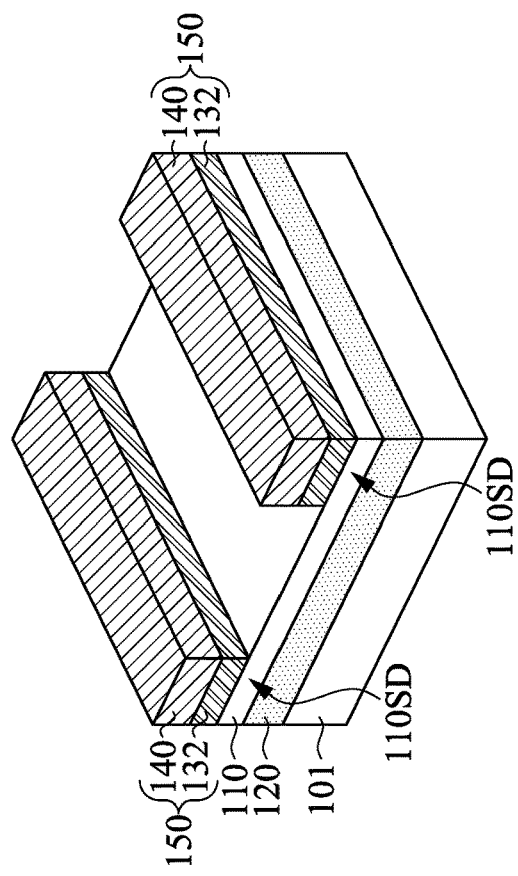

Reference is made to FIG. 12. The patterned mask MA1 is removed, leaving portions of the first and second metal layers 132 and 140 in the openings O1 of the patterned mask MA1 over the regions 110SD of the 2-D material layer 110. On the other hand, portions of the first and second metal layers 132 and 140 over the top surface of the patterned mask MA1 are removed together with the patterned mask MA1.

After the patterned mask MA1 is removed, source/drain contacts 150 are formed. In some embodiments, each of the source/drain contacts 150 includes a first metal layer 132 and a second metal layer 140 over the first metal layer 132.

In some other embodiments, aside from the lift-off procedure as described in FIGS. 3 and 4, the source/drain contacts 150 may also be formed by, for example, depositing a first metal layer 130 and a second metal layer 140 over the substrate 101, and then performing a patterning process to selectively etch (or remove) unwanted portions of the first metal layer 130 and the second metal layer 140. In some embodiments, the first metal layer 132 made of antimonene may be etched by alkaline solutions.

Figure 13:
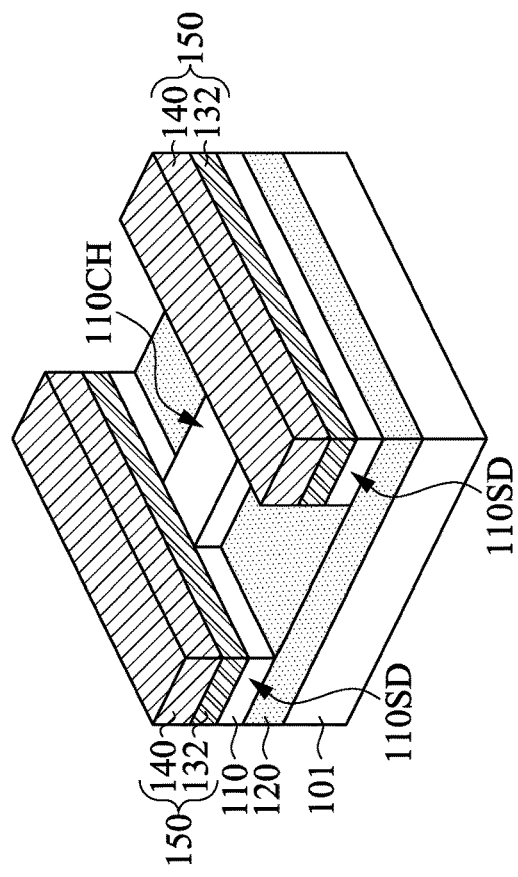

Reference is made to FIG. 13. The 2-D material layer 110 is patterned, so as to form a channel region 110CH in the 2-D material layer 110 this is between the source/drain regions 110SD of the 2-D material layer 110.

After the channel region 110CH is formed in the 2-D material layer 110, a transistor may be formed. In some embodiments, the transistor may include a 2-D material channel layer 110, a gate structure 135 disposed on a bottom surface of the 2-D material channel layer 110, and source/drain contacts 150 disposed on a top surface of the 2-D material channel layer 110.

Figure 14:
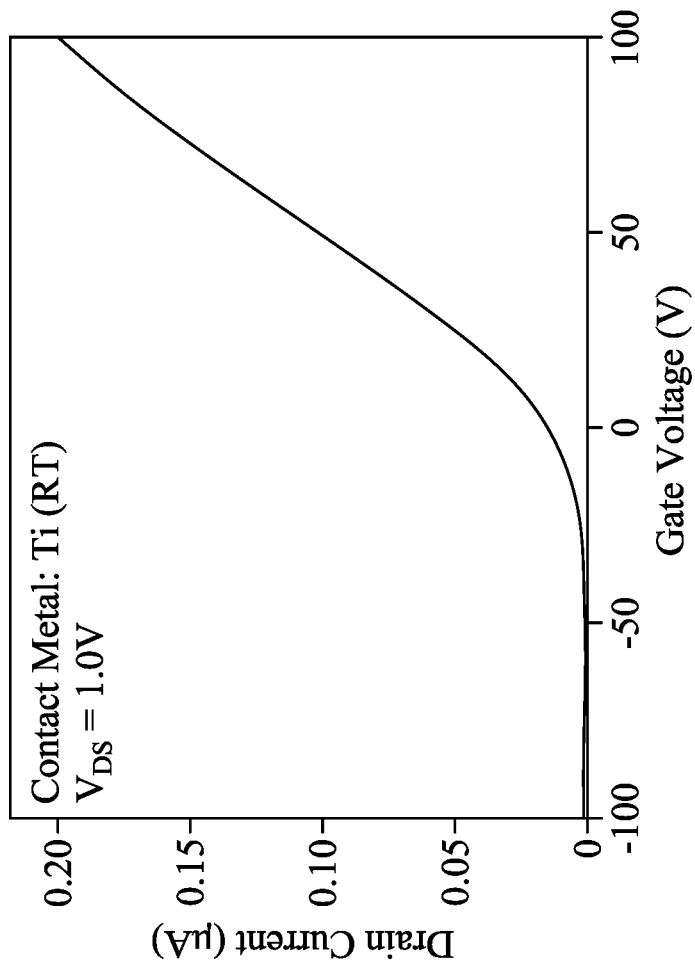
FIG. 14 is an experiment result in accordance with some embodiments of the present disclosure.

FIG. 14 is an experiment result in accordance with some embodiments of the present disclosure. In greater details, FIG. 14 is an experiment result of the device shown in FIG. 5. For example, a bottom-gate transistor with 20 nm Ti (e.g., first metal layer 130) deposited on a MoS$_2$ film (e.g., 2-D material layer 110) at room temperature RT (e.g., 25° C. to about 27° C.) as the contact metal is fabricated. Following the deposition of the 20 nm Ti, the other 100 nm Au (e.g., the second metal layer 140) is also deposited at room temperature (e.g., 25° C. to about 27° C.) for better contact of the source/drain contacts. The transfer curve of the device is shown in FIG. 14. By using the equation $\mu=(dI_{DS}/dV_{GS})\times(L/W)\times(t/\varepsilon)\times V_{DS}^{-1}$, a lower field-effect mobility $6.42\times10^{-2}$ cm$^2$ V$^{-1}$ s$^{-1}$ derived through the transfer curve is obtained for the device. Although the results may indicate that the inferior crystallinity of the grown MoS$_2$ film is the main mechanism responsible for the low field-effect mobility value, the high contact resistance between the contact metal and 2-D material surface may be the other mechanism responsible for this phenomenon.

Figure 15:
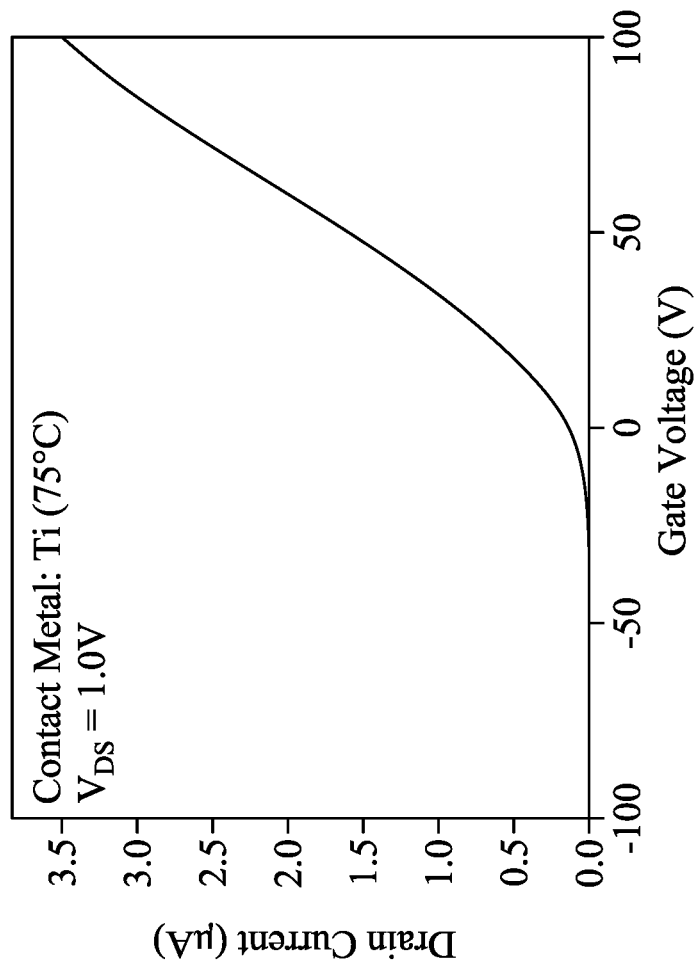
FIG. 15 is an experiment result in accordance with some embodiments of the present disclosure.

FIG. 15 is an experiment result in accordance with some embodiments of the present disclosure. In greater details, FIG. 15 is an experiment result of the device shown in FIG. 5. Based on the above discussion, the crystallinity of the contact metal will also influence the contact resistance at the metal/2D material interface. Therefore, an improved crystallinity of the Ti film may further reduce the contact resistance. Following similar device fabrication procedure except for a higher substrate temperature during the contact metal deposition, the other MoS$_2$ bottom-gate transistor with Au/Ti electrodes is fabricated under a temperature about 70° C. to about 80° C. (e.g., 75° C.). Although higher deposition temperature may further enhance the crystallinity of the Ti film, the relatively low growth temperature (75° C.) adopted for the contact metal formation may be used to prevent the deterioration of the photoresist at even higher deposition temperatures. The transfer curve of the device is shown in FIG. 15. Compared with the device with Ti deposited at room temperature as described in FIG. 14, over ten times of drain current enhancement is observed for the device. A higher field-effect mobility value 1.23 cm$^2$ V$^{-1}$ s$^{-1}$ is also observed for the device with about 75° C. contact metal deposition temperature. The ON/OFF ratio of the device also increases to >105. The results demonstrate that besides the work function values, the crystallinity of the contact metal is the other important issue to reduce the contact resistance at the electrode/2D material interfaces.

Figure 16:
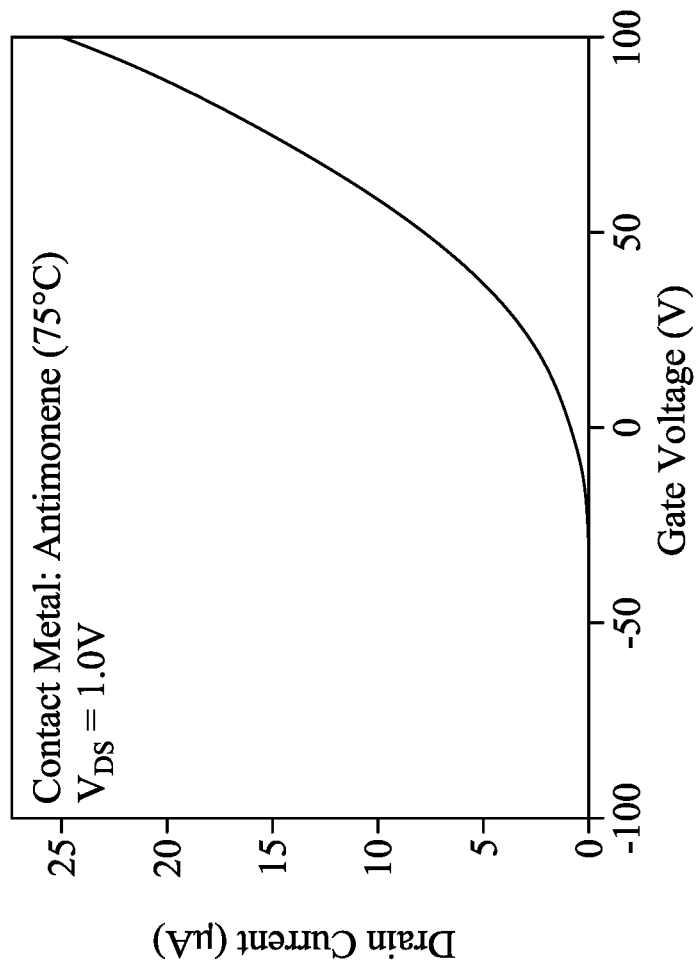
FIG. 16 is an experiment result in accordance with some embodiments of the present disclosure.

FIG. 16 is an experiment result in accordance with some embodiments of the present disclosure. In greater details, FIG. 16 is an experiment result of the device shown in FIG. 13. Based on the above discussion, because the melting point of Ti is higher than 1600° C., the 75° C. growth temperature of Ti (e.g., the first metal layer 130) may be still too low for the crystallization of the Ti film. In the embodiments of FIGS. 9 to 13, a conducting 2-D material of antimonene can be observed on a MoS$_2$ surface at 200° C. The 75° C. growth temperature may be high enough for antimonene formation. The small work function of antimonene (4.16 eV) also meets the requirement of Ohmic contact formation with MoS$_2$ channels. Following the fabrication procedure described in FIGS. 9 to 13, another device with Au/Sb electrodes deposited at about 70° C. to about 80° C. (e.g., 75° C.) is prepared. The transfer curve of the device is shown in FIG. 16. As shown in the figure, higher drain currents are observed. High field-effect mobility 11.80 cm$^2$ V$^{-1}$ s$^{-1}$ and >106 ON/OFF ratio is observed for the device.

Figure 17:
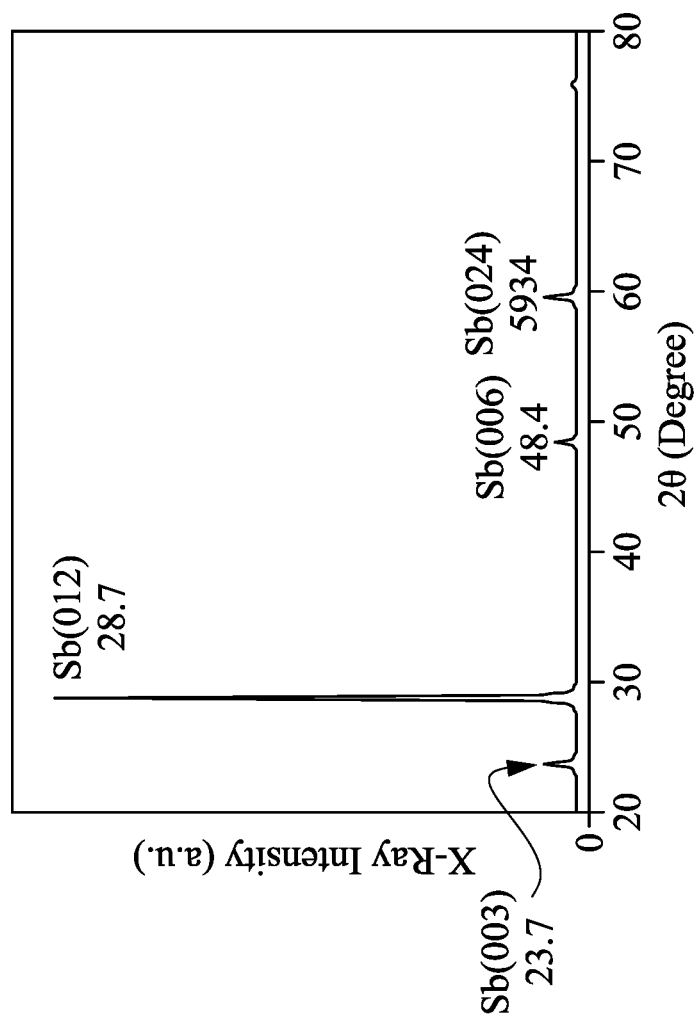
FIG. 17 is an experiment result in accordance with some embodiments of the present disclosure.

FIG. 17 is an experiment result in accordance with some embodiments of the present disclosure. In greater details, FIG. 17 is an experiment result of the device shown in FIG. 13. To investigate the crystallinity of the Sb film (e.g. the first metal layer 132), another sample with 50 nm Sb film deposited on mono-layer MoS$_2$ at about 75° C. is prepared.

The 2θ-θ curve of the sample measured by the XRD system is shown in FIG. 17. The observations of Sb (012) and (024) peaks at 28.7° and 59.4° suggest that the elemental 2-D material antimonene can be formed on $MoS_2$ surface at about 75° C. However, compared with the antimonene film grown at 200° C., the observations of additional Sb (003) and (006) peaks at 23.7° and 48.4° suggest that a polycrystalline instead of single-crystal antimonene film is obtained at a relatively lower deposition temperature 75° C. Nevertheless, compared with the devices with contact metal Ti deposited at RT and 75° C., performance enhancement of the device with antimony film deposited at 75° C. is observed. The results suggest that the high contact resistance between contact metals and 2-D material channels may be a limiting factor for the performances of such devices. Contact metals with appropriate work function values, the temperature required for its crystallization and the possibility of integration such materials into device fabrication procedures are important issues for the fabrications of high-performance 2-D material devices.

Figure 18:
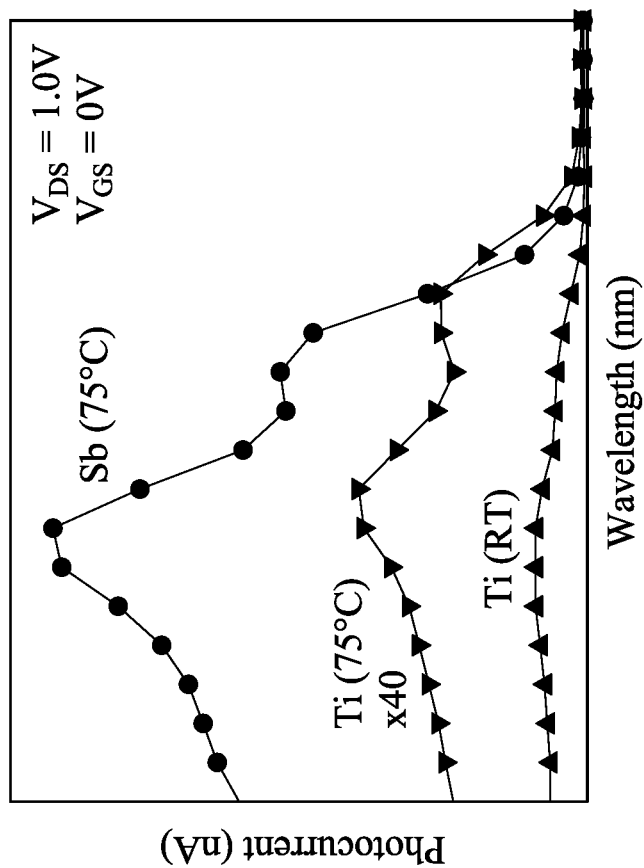
FIG. 18 is an experiment result in accordance with some embodiments of the present disclosure.

FIG. 18 is an experiment result in accordance with some embodiments of the present disclosure. In some embodiments, because the monolayer $MoS_2$ is a direct-bandgap semiconductor because of quantum-mechanical confinement, the direct bandgap may allow a high absorption coefficient and efficient electron-hole pair generation under photoexcitation. Accordingly, the devices shown in FIGS. 5 and 13 can also serve as a photodetector when the 2-D material layer 110 is a single monolayer material instead of 2 or more monolayers. FIG. 18 shows experiment results of three devices, in which the first device may be the device shown in FIG. 5 where the first metal layer 130 is formed of Ti under RT, the second device may be the device shown in FIG. 5 where the first metal layer 130 is formed of Ti under 75° C., and the third device may be the device shown in FIG. 13 where the first metal layer 132 is formed of Sb under 75° C.

The spectral response curves of the three devices at VDS=1.0 V and VGS=0 V with different contact metals of 20 nm Ti deposited at RT and 75° C. and Sb deposited at 75° C. are shown. As shown in the figure, the cutoff wavelength of the $MoS_2$ photo-transistors is between about 650 and about 700 nm, which is consistent with PL peak wavelength 658 nm of the mono-layer $MoS_2$ sample shown in FIG. 8B. The results suggest that the photocurrents come from the light absorption of the mono-layer $MoS_2$ channel. On the other hand, compared with the device with Ti contact metal deposited at RT, the photocurrent of the device with the antimony contact metal deposited at 75° C. is over two orders of magnitudes higher. Since the same mono-layer $MoS_2$ channels are adopted for the three devices, the phenomenon indicates that with reduced contact resistance, less carrier recombination will occur at the metal/2D material interface. In this case, the measured photocurrents of the photo-transistor will be closer to the actual photocurrents resulted from the light absorption of the 2D material channels.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provides a 2-D material transistor, in which the 2-D material is deposited using an ALD process to form $MoO_3$, superior performances may be obtained for $MoS_2$ transistors. Embodiments of the present disclosure provides a 2-D material transistor, in which the source/drain contact includes a 2-D material metal layer (e.g., antimonene), superior performances may be obtained for the $MoS_2$ transistor with polycrystalline antimonene contact electrode. Moreover, with lower Schottky barriers at the electrode/2-D material interfaces, enhanced photocurrent collection efficiency is obtained for a $MoS_2$ photo-transistors such that higher responsivity is observed for the device, which is advantageous for the light detection application of 2-D materials.

According to some embodiments of the present disclosure, a method includes forming a gate dielectric layer over a gate electrode layer; forming a 2-D material layer over the gate dielectric layer; forming source/drain contacts over source/drain regions of the 2-D material layer, in which each of the source/drain contacts includes an antimonene layer and a metal layer over the antimonene layer; and after forming the source/drain contacts, removing a first portion of the 2-D material layer exposed by the source/drain contacts, while leaving a second portion of the 2-D material layer remaining over the gate dielectric layer as a channel region.

In some embodiments, forming the source/drain contacts includes forming a patterned mask over the 2-D material layer, in which the patterned mask includes openings exposing the source/drain regions of the 2-D material layer; depositing a material of the antimonene layer in the openings under a temperature in a range from 70° C. to about 80° C.; depositing a material of the metal layer in the openings; and removing the patterned mask.

In some embodiments, the antimonene layer has a polycrystalline structure.

In some embodiments, the 2-D material layer is made of transition metal dichalcogenides (TMDs).

In some embodiments, the 2-D material layer is made of molybdenum disulfide ($MoS_2$).

In some embodiments, forming the 2-D material layer includes depositing the 2-D material layer over a substrate, in which depositing the 2-D material layer includes supplying a first precursor of molybdenum hexacarbonyl ($Mo(Co)_6$) and a second precursor of ozone (O3) over the substrate to deposit a $MoO_3$ film over the substrate; and performing a sulfurization process to the $MoO_3$ film to convert the $MoO_3$ film into a $MoS_2$ film; and transferring the 2-D material layer from the substrate to a top surface of the gate dielectric layer.

In some embodiments, the source/drain contacts are arranged along a first direction, and in which the channel region is narrower than one of the source/drain regions along a second direction that is perpendicular to the first direction.

In some embodiments, in which removing the first portion of the 2-D material layer is performed such that a top surface of the gate dielectric layer is exposed by the 2-D material layer.

According to some embodiments of the present disclosure, a method includes depositing a molybdenum disulfide ($MoS_2$) layer over a substrate, in which depositing the MoS2 layer includes supplying a first precursor of molybdenum hexacarbonyl ($Mo(Co)_6$) and a second precursor of ozone ($O_3$) over the substrate to deposit a $MoO_3$ film over the substrate; and performing a sulfurization process to the $MoO_3$ film to convert the $MoO_3$ film into a $MoS_2$ film; transferring the $MoS_2$ layer from the substrate to a top surface of a gate dielectric layer over a gate electrode layer; forming source/drain contacts over source/drain regions of the $MoS_2$ layer, in which each of the source/drain contacts includes a first metal layer and a second metal layer over the first metal layer; and after forming the source/drain contacts, removing a first portion of the MoS$_2$ layer exposed by the source/drain contacts, while leaving a second portion of the MoS$_2$ layer remaining over the gate dielectric layer as a channel region.

In some embodiments, the channel region of the MoS$_2$ layer is operated as an n-type channel, the first metal layer has a work function value smaller than a work function value of the MoS$_2$ layer.

In some embodiments, the channel region of the MoS$_2$ layer is operated as a p-type channel, the first metal layer has a work function value larger than a work function value of the MoS$_2$ layer.

In some embodiments, the channel region of the MoS$_2$ layer is operated as an n-type channel, the first metal layer is made of a 2-D material metal layer and has a work function value smaller than a work function value of the MoS$_2$ layer.

In some embodiments, the 2-D material metal layer includes antimonene.

In some embodiments, the work function value of the first metal layer is smaller than the work function value of the second metal layer.

In some embodiments, forming the source/drain contacts includes forming a patterned mask over the MoS$_2$ layer, in which the patterned mask includes openings exposing the source/drain regions of the MoS$_2$ layer; depositing a material of the first metal layer in the openings under a temperature in a range from 70° C. to about 80° C.; depositing a material of the second metal layer in the openings; and removing the patterned mask.

According to some embodiments of the present disclosure, a device includes a gate electrode, a gate dielectric layer, a 2-D material layer, and source/drain contacts. The gate dielectric layer is over the gate electrode. The 2-D material layer is over the gate dielectric layer, in which the 2-D material layer includes a channel region and source/drain regions on opposite sides of the channel region. The source/drain contacts are disposed on the source/drain regions of the 2-D material layer, respectively, in which each of the source/drain contacts includes an antimonene layer and a metal layer over the antimonene layer.

In some embodiments, a work function value of the antimonene layer is smaller than a work function value of the 2-D material layer.

In some embodiments, a work function value of the antimonene layer is smaller than a work function value of the metal layer.

In some embodiments, the antimonene layer has a polycrystalline structure.

In some embodiments, the 2-D material layer is made of transition metal dichalcogenides (TMDs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate dielectric layer over a gate electrode layer;
    forming a 2-D material layer over the gate dielectric layer;
    forming source/drain contacts over source/drain regions of the 2-D material layer, wherein each of the source/drain contacts comprises an antimonene layer and a metal layer over the antimonene layer, wherein the antimonene layer has a polycrystalline structure; and
    after forming the source/drain contacts, removing a first portion of the 2-D material layer exposed by the source/drain contacts, while leaving a second portion of the 2-D material layer remaining over the gate dielectric layer as a channel region.

2. The method of claim 1, wherein forming the source/drain contacts comprises:
    forming a patterned mask over the 2-D material layer, wherein the patterned mask comprises openings exposing the source/drain regions of the 2-D material layer;
    depositing a material of the antimonene layer in the openings under a temperature in a range from 70° C. to about 80° C.;
    depositing a material of the metal layer in the openings; and
    removing the patterned mask.

3. The method of claim 1, wherein the 2-D material layer is made of transition metal dichalcogenides (TMDs).

4. The method of claim 1, wherein the 2-D material layer is made of molybdenum disulfide (MoS$_2$).

5. The method of claim 4, wherein forming the 2-D material layer comprises:
    depositing the 2-D material layer over a substrate, wherein depositing the 2-D material layer comprises:
        supplying a first precursor of molybdenum hexacarbonyl (Mo(Co)$_6$) and a second precursor of ozone (O3) over the substrate to deposit a MoO$_3$ film over the substrate; and
        performing a sulfurization process to the MoO$_3$ film to convert the MoO$_3$ film into a MoS$_2$ film; and
        transferring the 2-D material layer from the substrate to a top surface of the gate dielectric layer.

6. The method of claim 1, wherein the source/drain contacts are arranged along a first direction, and wherein the channel region is narrower than one of the source/drain regions along a second direction that is perpendicular to the first direction.

7. The method of claim 1, wherein removing the first portion of the 2-D material layer is performed such that a top surface of the gate dielectric layer is exposed by the 2-D material layer.

8. A method, comprising:
    depositing a molybdenum disulfide (MoS$_2$) layer over a substrate, wherein depositing the MoS$_2$ layer comprises:
        supplying a first precursor of molybdenum hexacarbonyl (Mo(Co)$_6$) and a second precursor of ozone (O3) over the substrate to deposit a MoO$_3$ film over the substrate; and
        performing a sulfurization process to the MoO$_3$ film to convert the MoO$_3$ film into a MoS$_2$ film;
    transferring the MoS$_2$ layer from the substrate to a top surface of a gate dielectric layer over a gate electrode layer;
    forming source/drain contacts over source/drain regions of the MoS$_2$ layer, wherein each of the source/drain contacts comprises a first metal layer and a second metal layer over the first metal layer, and wherein forming the source/drain contacts comprises:

forming a patterned mask over the MoS$_2$ layer, wherein the patterned mask comprises openings exposing the source/drain regions of the MoS$_2$ layer;

depositing a material of the first metal layer in the openings under a temperature in a range from 70° C. to about 80° C.;

depositing a material of the second metal layer in the openings; and removing the patterned mask; and after forming the source/drain contacts, removing a first portion of the MoS$_2$ layer exposed by the source/drain contacts, while leaving a second portion of the MoS$_2$ layer remaining over the gate dielectric layer as a channel region.

9. The method of claim 8, wherein the channel region of the MoS$_2$ layer is operated as an n-type channel, the first metal layer has a work function value smaller than a work function value of the MoS$_2$ layer.

10. The method of claim 8, wherein the channel region of the MoS$_2$ layer is operated as a p-type channel, the first metal layer has a work function value larger than a work function value of the MoS$_2$ layer.

11. The method of claim 8, wherein the channel region of the MoS$_2$ layer is operated as an n-type channel, the first metal layer is made of a 2-D material metal layer and has a work function value smaller than a work function value of the MoS$_2$ layer.

12. The method of claim 11, wherein the 2-D material metal layer includes antimonene.

13. The method of claim 11, wherein the work function value of the first metal layer is smaller than the work function value of the second metal layer.

14. A method, comprising:

forming a 2-D material layer over a top surface of a gate structure;

forming source/drain contacts on source/drain regions of the 2-D material layer, respectively, wherein each of the source/drain contacts comprises an antimonene layer and a metal layer over the antimonene layer, wherein the antimonene layer has a polycrystalline structure; and patterning a portion of the 2-D material layer laterally between the source/drain regions of the 2-D material layer to form a channel region of the 2-D material layer.

15. The method of claim 14, wherein a work function value of the antimonene layer is smaller than a work function value of the 2-D material layer.

16. The method of claim 14, wherein a work function value of the antimonene layer is smaller than a work function value of the metal layer.

17. The method of claim 14, wherein the 2-D material layer is made of transition metal dichalcogenides (TMDs).

18. The method of claim 14, wherein the 2-D material layer is made of molybdenum disulfide (MoS$_2$).

19. The method of claim 18, wherein forming the 2-D material layer comprises:

depositing the 2-D material layer over a substrate, wherein depositing the 2-D material layer comprises:

supplying a first precursor of molybdenum hexacarbonyl (Mo(Co)$_6$) and a second precursor of ozone (O$_3$) over the substrate to deposit a MoO$_3$ film over the substrate; and performing a sulfurization process to the MoO$_3$ film to convert the MoO$_3$ film into a MoS$_2$ film; and transferring the 2-D material layer from the substrate to a top surface of a gate dielectric layer of the gate structure.

20. The method of claim 14, wherein forming the source/drain contacts comprises:

forming a patterned mask over the 2-D material layer, wherein the patterned mask comprises openings exposing the source/drain regions of the 2-D material layer;

depositing a material of the antimonene layer in the openings under a temperature in a range from about 70° C. to about 80° C.;

depositing a material of the metal layer in the openings; and removing the patterned mask.

* * * * *